(12) United States Patent
Zhang et al.

(10) Patent No.: US 10,615,282 B2
(45) Date of Patent: Apr. 7, 2020

(54) THIN-FILM TRANSISTOR AND MANUFACTURING METHOD THEREOF, ARRAY SUBSTRATE, AND DISPLAY APPARATUS

(71) Applicant: BOE TECHNOLOGY GROUP CO., LTD., Beijing (CN)

(72) Inventors: Huijuan Zhang, Beijing (CN); Chienhung Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/534,467

(22) PCT Filed: Nov. 25, 2016

(86) PCT No.: PCT/CN2016/107172
§ 371 (c)(1),
(2) Date: Jun. 8, 2017

(87) PCT Pub. No.: WO2017/166833
PCT Pub. Date: Oct. 5, 2017

(65) Prior Publication Data
US 2019/0027612 A1 Jan. 24, 2019

(30) Foreign Application Priority Data
Mar. 29, 2016 (CN) .......................... 2016 1 0189104

(51) Int. Cl.
*H01L 29/66* (2006.01)
*H01L 29/786* (2006.01)
*H01L 29/417* (2006.01)
*H01L 27/12* (2006.01)
*H01L 21/768* (2006.01)
(Continued)

(52) U.S. Cl.
CPC .. *H01L 29/78663* (2013.01); *H01L 21/76832* (2013.01); *H01L 27/1218* (2013.01);
(Continued)

(58) Field of Classification Search
CPC .......................... H01L 29/78663; H01L 29/458
(Continued)

(56) References Cited

U.S. PATENT DOCUMENTS

| 6,596,573 B2 * | 7/2003 | Lee ................... H01L 29/41733 |
| | | 257/E21.413 |
| 2006/0145162 A1 * | 7/2006 | Yang ................... G02F 1/13454 |
| | | 257/72 |

(Continued)

OTHER PUBLICATIONS

1st Office Action dated Feb. 13, 2018 in CN201610189104.0.
(Continued)

*Primary Examiner* — Davi Vu
*Assistant Examiner* — Brandon C Fox
(74) *Attorney, Agent, or Firm* — Syncoda LLC; Feng Ma

(57) ABSTRACT

The present disclosure provides a method for manufacturing a thin-film transistor and a thin-film transistor manufactured thereby, an array substrate and a display apparatus. The method comprises: forming a first layer; forming at least one etch stopper over the first layer; forming a second layer over the first layer and the at least one etch stopper; forming at least one contact via in the second layer, such that a bottom opening of each contact via contacts with a top surface of one etch stopper; and forming at least one electrode in the at least one contact via, such that each electrode extends in one contact via respectively, and is in contact with, and electrically coupled with, the one etch stopper. The at least one etch stopper comprises a composition. The composition is capable of blocking etching to the first layer during formation of the at least one contact via in the second layer; and the composition also has one of the following characteristics: an oxidization product of the composition is readily removable by a solution; an oxidization product is conductive; or the composition is resistant to oxidization.

18 Claims, 10 Drawing Sheets

(51) Int. Cl.
*H01L 29/45* (2006.01)
*H01L 27/32* (2006.01)
(52) U.S. Cl.
CPC .... *H01L 27/1248* (2013.01); *H01L 29/41733* (2013.01); *H01L 29/458* (2013.01); *H01L 29/6675* (2013.01); *H01L 29/66757* (2013.01); *H01L 29/66765* (2013.01); *H01L 29/78675* (2013.01); *H01L 29/78678* (2013.01); *H01L 27/3244* (2013.01)
(58) Field of Classification Search
USPC .................................................... 257/43, 72
See application file for complete search history.

(56) References Cited

U.S. PATENT DOCUMENTS

| | | | |
|---|---|---|---|
| 2008/0191207 A1* | 8/2008 | Nishiura | H01L 29/66621 257/59 |
| 2011/0303923 A1* | 12/2011 | Noh | H01L 29/458 257/72 |
| 2013/0095606 A1* | 4/2013 | Bayraktaroglu | H01L 29/7869 438/104 |
| 2014/0061633 A1* | 3/2014 | Wang | H01L 21/02172 257/43 |
| 2015/0034933 A1* | 2/2015 | Hong | H01L 29/66969 257/40 |
| 2015/0171224 A1 | 6/2015 | Liu et al. | |
| 2015/0295094 A1* | 10/2015 | Ren | H01L 29/66757 257/66 |
| 2016/0247823 A1 | 8/2016 | Zuo et al. | |
| 2016/0343739 A1* | 11/2016 | Liu | H01L 29/458 |

OTHER PUBLICATIONS

International Search Report and Written Opinion dated Mar. 9, 2017 in PCT/CN2016/107172.
Extended European Search Report daated Oct. 14, 2019 in EP16869379.4.

* cited by examiner

THIN-FILM TRANSISTOR AND MANUFACTURING METHOD THEREOF, ARRAY SUBSTRATE, AND DISPLAY APPARATUS

CROSS-REFERENCE TO RELATED APPLICATION

The present application claims priority to Chinese Patent Application No. 201610189104.0 filed on Mar. 29, 2016, the disclosure of which is hereby incorporated by reference in its entirety.

TECHNICAL FIELD

The present disclosure relates generally to display technologies, and more specifically to a thin-film transistor and its manufacturing method, an array substrate, and a display apparatus.

BACKGROUND

Thin-film transistors are employed to produce high-end display apparatuses with high-quality display effects. Each pixel on a display panel in a display apparatus is driven to emit light by a thin-film transistor integrated in the display panel.

At present, the manufacturing method of a thin-film transistor typically comprises the following steps:

Forming an active layer, wherein the active layer comprises a source doping region and a drain doping region;

Depositing an insulating layer over the active layer;

Etching the insulating layer over the source doping region and over the drain doping region respectively to thereby expose the source doping region and the drain doping region and form two contact vias;

Depositing a source-drain metal layer over the insulating layer and forming a source electrode and a drain electrode through a patterning process over the source-drain metal layer.

The conventional manufacturing method of a thin-film transistor as described above includes at least the following issues:

At present, due to the difficulty to control the etching process, issues such as over-etching and under-etching with regard to the contact vias often arise during etching of the insulating layer to form contact vias. Both the issue of over-etching and the issue of under-etching can have adverse effects to the thin-film transistors that are manufactured this way, which can ultimately lead to reduced yield of the thin-film transistors.

SUMMARY

In order to solve the issues in manufacturing the thin-film transistor in existing display technologies as noted above, the present disclosure provide a thin-film transistor, its manufacturing method, an array substrate and a display apparatus.

In a first aspect, the present disclosure provides a method for manufacturing a thin-film transistor. The method comprises the following steps:

forming a first layer;

forming at least one etch stopper over the first layer;

forming a second layer over the first layer and the at least one etch stopper;

forming at least one contact via in the second layer, such that a bottom opening of each contact via contacts with a top surface of one etch stopper; and forming at least one electrode in the at least one contact via, such that each electrode extends in one contact via respectively, and is in contact with, and electrically coupled with, the one etch stopper.

In the above method, the at least one etch stopper comprises a composition. The composition is capable of blocking etching to the first layer during formation of the at least one contact via in the second layer; and the composition also has one of the following characteristics: an oxidization product of the composition is readily removable by a solution; an oxidization product is conductive; or the composition is to resistant to oxidization.

In some preferred embodiments of the method, an oxidization product of the composition is readily removable by a solution. As such, the composition can comprise at least one of molybdenum, titanium, or aluminum. In a preferred embodiment, the composition can be molybdenum.

In some embodiments of the method, the first layer is an active layer; the second layer is an insulating layer; the at least one contact via comprises a first contact via and a second contact via; the at least one etch stopper comprises a first etch stopper and a second etch stopper; and the at least one electrode comprises a source electrode and a drain electrode, disposed in the first contact via and the second contact via respectively, and electrically coupled with the first etch stopper and the second etch stopper respectively.

In some of the embodiments as described above, the active layer can comprise low temperature poly-silicon (LTPS). As such, between the step of forming a first layer and the step of forming at least one etch stopper over the first layer, the method can further comprise: forming at least one doping region in the first layer, and the step of forming at least one etch stopper over the first layer comprises: forming at least one etch stopper respectively over the at least one doping region in the first layer.

In some of the embodiments as described above, prior to the step of forming a first layer, the method can further comprise: forming a gate electrode over a substrate; and forming a gate insulating layer over the gate electrode and the substrate. The step of forming a first layer can thus comprise: forming an active layer over the gate insulating layer, and the step of forming a second layer over the first layer and the at least one etch stopper can comprise: forming an insulating layer over the gate insulating layer, the active layer, the first etch stopper, and the second etch stopper.

In some of the embodiments as described above, between the step of forming a second layer over the first layer and the at least one etch stopper and the step of forming at least one contact via in the second layer, the method further comprises: forming a gate electrode over the insulating layer, and forming a gate insulating layer over the gate electrode and the insulating layer. The step of forming at least one contact via in the second layer can thus comprise: forming a first contact via and a second contact via through the insulating layer and the gate insulating layer.

Furthermore, prior to the step of forming a first layer, the method further comprises: forming a buffer layer over a substrate. The step of forming a first layer can thus comprise: forming an active layer over the buffer layer, and the step of forming a second layer over the first layer and the at least one etch stopper can comprise: forming an insulating layer over the buffer layer, the active layer, the first etch stopper, and the second etch stopper.

In some of the embodiments as described above, the method can further comprise:

forming a planarizing layer over the insulating layer, the source electrode and the drain electrode, wherein the planarizing layer is provided with a third contact via, disposed over the source electrode; and forming an anode layer over the planarizing layer, wherein the anode layer is configured to electrically couple with the source electrode through the third contact via.

In a second aspect, the present disclosure provides a thin-film transistor manufactured by any one of the embodiments of the method as described above.

The thin-film transistor comprises a first layer; at least one etch stopper, disposed over the first layer; a second layer, disposed over the first layer and the at least one etch stopper; at least one contact via, disposed in the second layer and configured such that a bottom opening of each contact via is in contact with a top surface of one etch stopper; and at least one electrode, disposed in the at least one contact via and configured such that each electrode extends in one contact via respectively, and is in contact with, and electrically coupled with, the one etch stopper.

In the thin-film transistor, the at least one etch stopper comprises a composition. The composition is capable of blocking etching to the first layer during formation of the at least one contact via in the second layer; and the composition also has one of the following characteristics: an oxidization product of the composition is readily removable by a solution; an oxidization product is conductive; or the composition is resistant to oxidation.

In some preferred embodiments of the thin-film transistor, an oxidization product of the composition is readily removable by a solution. As such, the composition can comprise at least one of molybdenum, titanium, or aluminum. In a preferred embodiment, the composition can comprise molybdenum.

In the thin-film transistor as described above, the first layer can be an active layer; the at least one etch stopper can comprise a first etch stopper and a second etch stopper; the second layer can be an insulating layer; the at least one contact via can comprise two contact vias; and at least one electrode can comprise a source electrode and a drain electrode.

In some embodiments, the thin-film transistor can further comprise a gate electrode and a gate insulating layer. The gate electrode can be disposed over the insulating layer; the gate insulating layer can be disposed over the insulating layer and the gate electrode; and the two contact vias can further run through the gate insulating layer.

In some other embodiments, the thin-film transistor can further comprise a gate electrode and a gate insulating layer. The gate electrode can be disposed over a substrate; and the gate insulating layer can be disposed over the substrate and the gate electrode and below the active layer and the insulating layer.

In yet some other embodiments, the thin-film transistor can further comprise a planarizing layer and an anode layer. The planarizing layer can be disposed over the insulating layer, the source electrode and the drain electrode, and can be provided with a third contact via; the anode layer can be disposed over the planarizing layer, and can be electrically coupled with the source electrode through the third contact via.

In some embodiments of the thin-film transistor, the active layer can comprise low temperature poly-silicon (LTPS); and the active layer can comprise a first doping region and a second doping region, wherein the first etch stopper and the second etch stopper are respectively disposed over the first doping region and the second doping region.

In some embodiments of the thin-film transistor, each electrode is of an N-layer structure, where N is an integer greater than 0; and a contact layer of each electrode, in contact with and electrically coupled to, one etch stopper, is configured to have a same composition as the one etch stopper.

In a third aspect, the present disclosure provides an array substrate. The array substrate comprises the thin-film transistor according to any of the embodiments as described above.

In a fourth aspect, the present disclosure provides a display apparatus. The display apparatus comprises the array substrate according to any of the embodiments as described above.

BRIEF DESCRIPTION OF THE DRAWINGS

To more clearly illustrate some of the embodiments of the present disclosure as described above, the following is a brief description of the drawings. The drawings in the following descriptions are only illustrative of some embodiments. For those of ordinary skill in the art, other drawings of other embodiments can become apparent based on these drawings.

DETAILED DESCRIPTION

Figure 1:
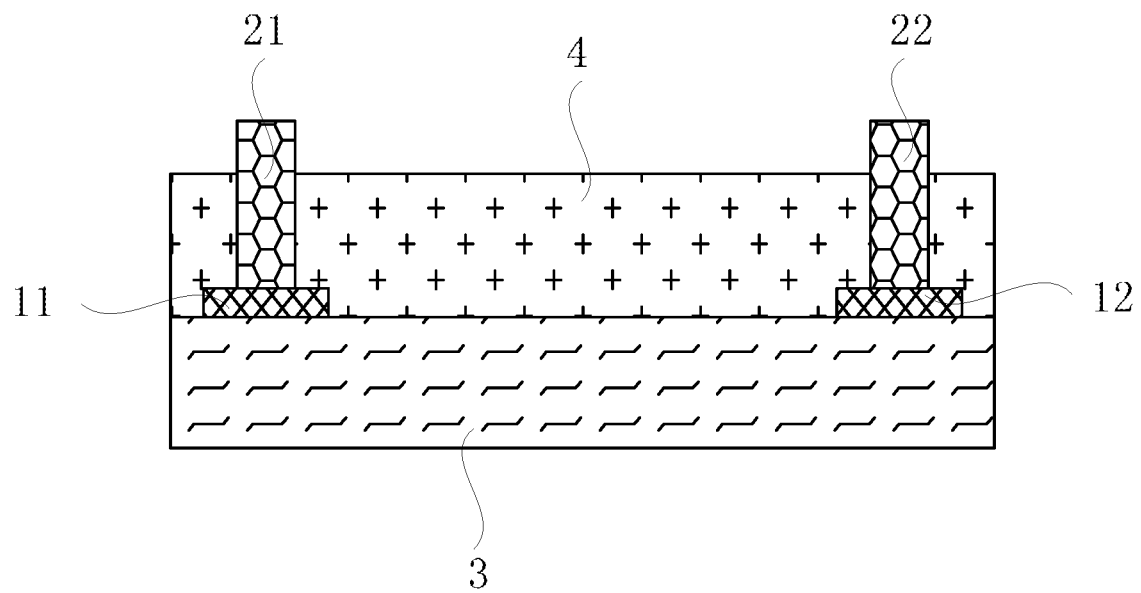
FIG. 1 is a schematic view of a structure of a thin-film transistor according to some embodiments of the present disclosure.

In the following, with reference to the drawings of various embodiments disclosed herein, the technical solutions of the embodiments of the present disclosure will be described in a clear and fully understandable way.

It is obvious that the described embodiments represent merely a portion, but not all, of the embodiments of the present disclosure. Based on the described embodiments of the present disclosure, those of ordinarily skills in the art can obtain other embodiment(s), which come(s) within the scope sought for protection by the present disclosure.

In order to address the issues associated with current technology in fabricating thin-film transistors, the present disclosure provides a method for manufacturing a thin-film transistor and a thin-film transistor manufactured thereby.

The method comprises: forming a first layer; forming at least one etch stopper over the first layer; forming a second layer over the first layer and the at least one etch stopper; forming at least one contact via in the second layer, such that a bottom opening of each contact via contacts with a top surface of one etch stopper; and forming at least one electrode in the at least one contact via, such that each electrode extends in one contact via respectively, and is in contact with, and electrically coupled with, the one etch stopper. The at least one etch stopper comprises a composition. The composition is capable of blocking etching to the first layer during formation of the at least one contact via in the second layer; and the composition also has one of the following characteristics: an oxidization product of the composition is readily removable by a solution; an oxidization product is conductive; or the composition is resistant to oxidization.

By applying the method as described above, a thin-film transistor can be manufactured. The thin-film transistor comprises a first layer; at least one etch stopper, disposed over the first layer; a second layer, disposed over the first layer and the at least one etch stopper; at least one contact via, disposed in the second layer and configured such that a bottom opening of each contact via is in contact with a top surface of one etch stopper; and at least one electrode, disposed in the at least one contact via and configured such that each electrode extends in one contact via respectively, and is in contact with, and electrically coupled with, the one etch stopper.

In the thin-film transistor, the at least one etch stopper comprises a composition. The composition is capable of blocking etching to the first layer during formation of the at least one contact via in the second layer; and the composition also has one of the following characteristics: an oxidization product of the composition is readily removable by a solution; an oxidization product is conductive; or the composition is resistant to oxidization.

Details of some embodiments of the method and the thin-film transistor are provided below.

In one aspect, the present disclosure provides a thin-film transistor. The thin-film transistor, according to some embodiments of the present disclosure as illustrated in FIG. 1-FIG. 6, comprises a first etch stopper 11, a second etch stopper 12, a source electrode 21, a drain electrode 22, an insulating layer 4, and an active layer 3.

The first etch stopper 11 and the second etch stopper 12 are disposed over the active layer 3. The insulating layer 4 is disposed over, and cover, the active layer 3, the first etch stopper 11, and the second etch stopper 12. The insulating layer 4 is provided with a first contact via 51 and a second contact via 52.

The source electrode 21 is electrically coupled with the active layer 3 through the first contact via 51, and the drain electrode 22 is electrically coupled with the active layer 3 through the second contact via 52.

The first etch stopper 11 is disposed between the active layer 3 and the source electrode 21, and the second etch stopper 12 is disposed between the active layer 3 and the drain electrode 22.

In the thin-film transistor according to the embodiments of the present disclosure as described above, when forming the first contact via 51 and the second contact via 52, the insulating layer 4 can be directly etched onto the first etch stopper 11 and the second etch stopper 12. The issue of under-etching can thereby be effectively solved.

On the other hand, the presence of the first etch stopper 11 and the second etch stopper 12 substantially blocks the etching to the active layer 3, thereby effectively solving the issue of over-etching. As such, the production yield of thin-film transistors can thus be improved.

The thin-film transistor according to the embodiments of the present disclosure as described above can optionally have the following features.

The thin-film transistor according to the embodiments can be a thin-film transistor of any structure. For example, the thin-film transistor can be a bottom-gate thin-film transistor, or can be a top-gate thin-film transistor.

Optionally, the insulating layer 4 can be of a single-layer structure, or can be of a double-layer structure.

Figure 2:
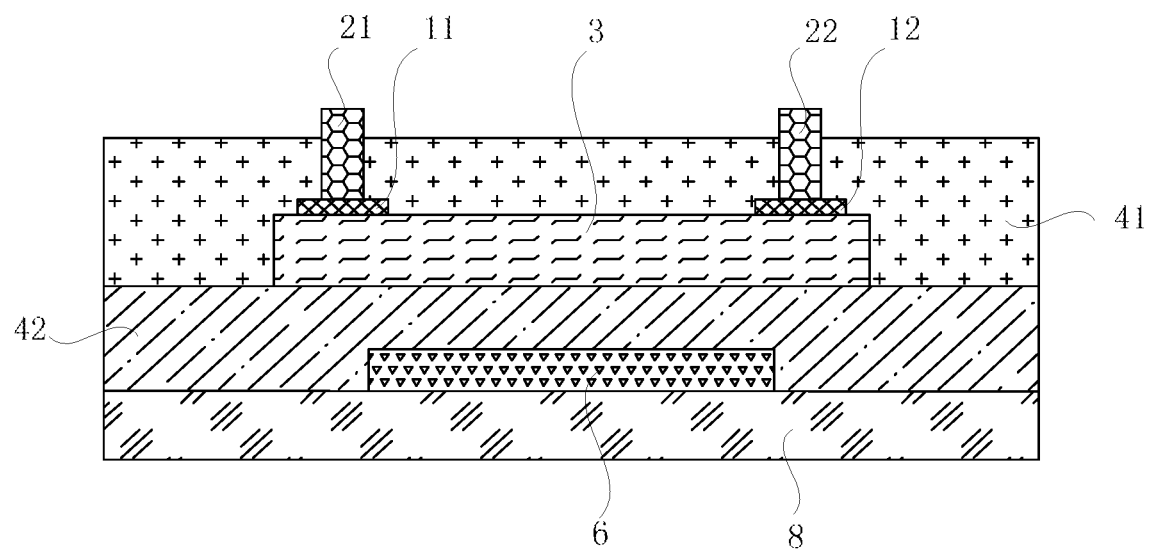
FIG. 2 is a schematic view of a structure of a thin-film transistor according to some embodiments of the present disclosure.
Figure 4:
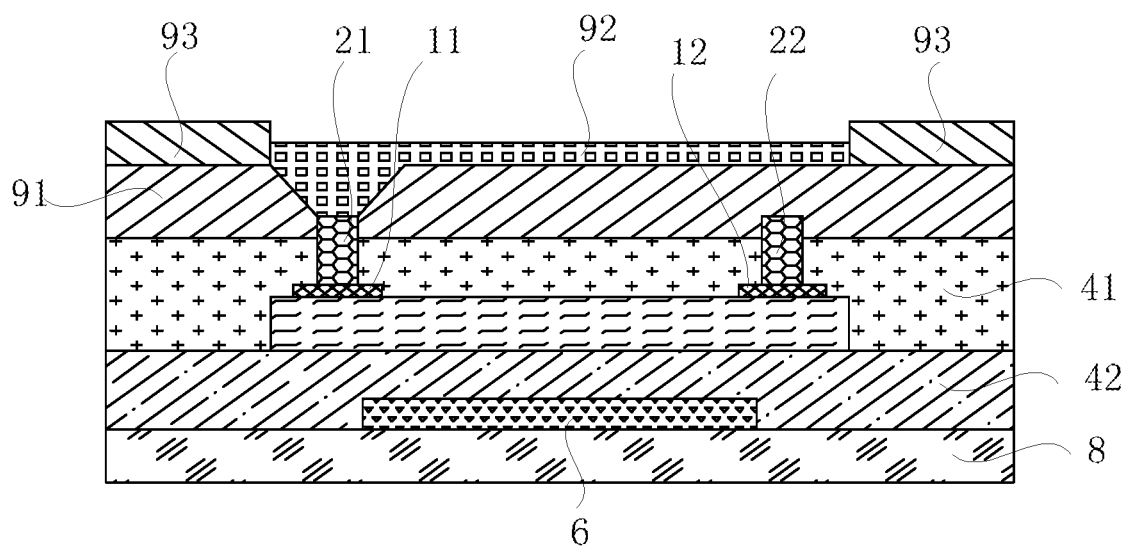
FIG. 4 is a schematic view of the structure of the thin-film transistor according to some embodiments of the present disclosure.

FIG. 2 and FIG. 4 illustrate a thin-film transistor with an insulating layer 4 having a single-layer structure, wherein the insulating layer 4 comprises an interlayer insulating layer 41. The thin-film transistor as such further includes a gate electrode 6 and a gate insulating layer 42.

The gate electrode 6 is disposed over a glass substrate 8. The gate insulating layer 42 is disposed over the glass substrate 8 and the gate electrode 6. The active layer 3, the first etch stopper 11 and the second etch stopper 12 are disposed between the gate insulating layer 42 and the interlayer insulating layer 41. The first etch stopper 11 and the second etch stopper 12 are disposed to be closer to the interlayer insulating layer 41.

When the insulating layer 4 is etched to form contact vias, the interlayer insulating layer 41 needs to be thoroughly etched to thereby expose the first etch stopper 11 and the second etch stopper 12 to complete the etching process to form the contact vias.

Figure 3:
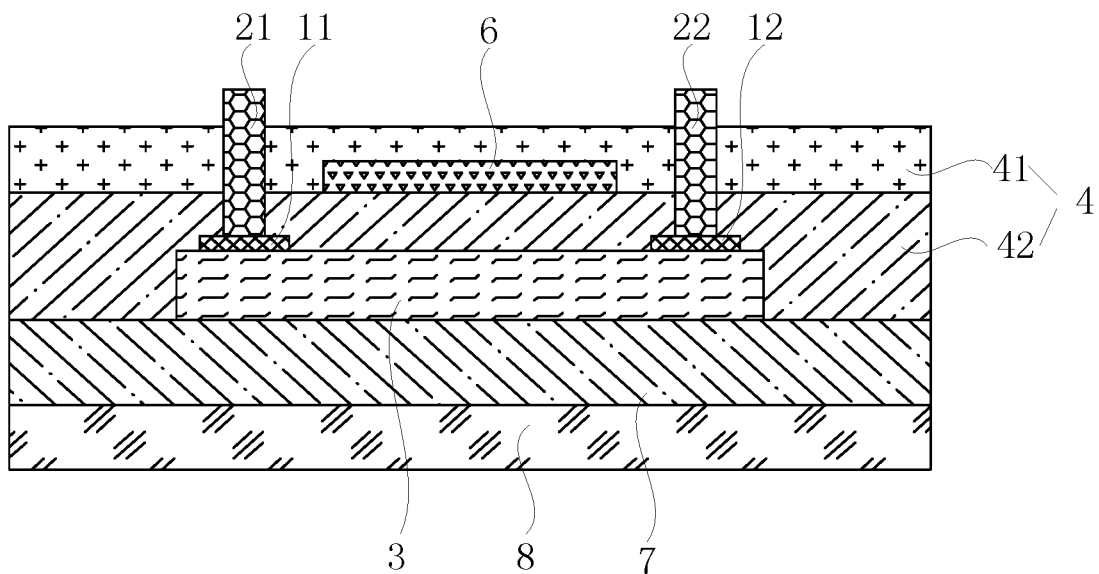
FIG. 3 is a schematic view of the structure of the thin-film transistor according to some embodiments of the present disclosure.
Figure 5:
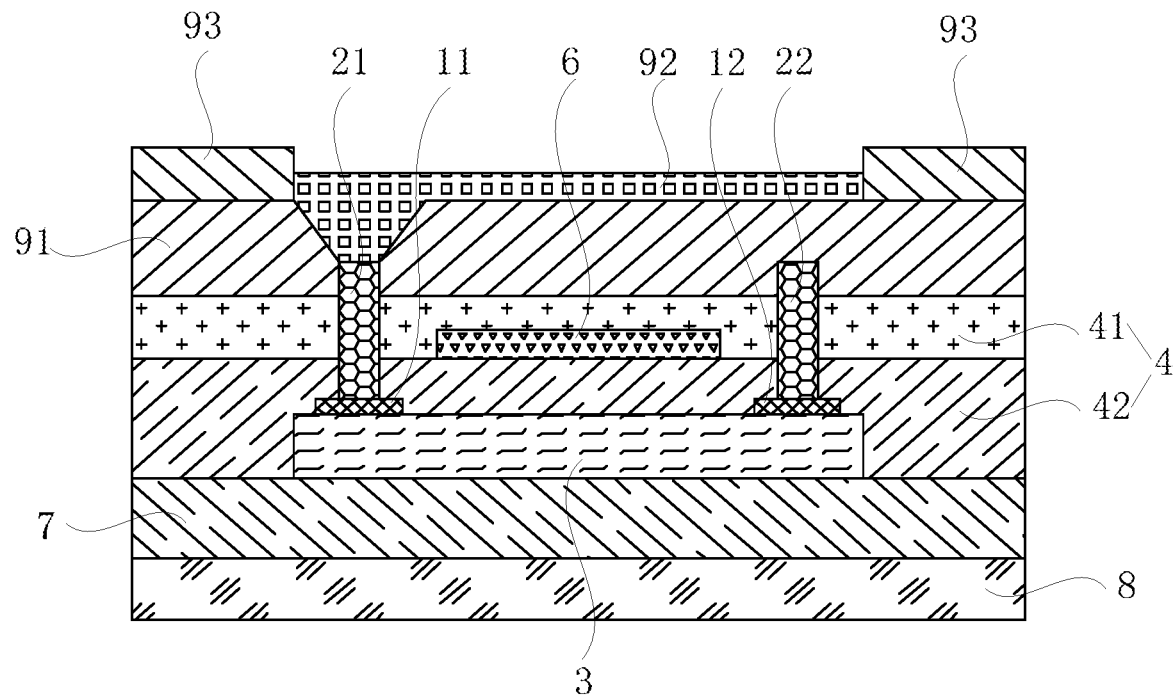
FIG. 5 is a schematic view of the structure of the thin-film transistor according to some embodiments of the present disclosure.

FIG. 3 and FIG. 5 illustrate a thin-film transistor with an insulating layer 4 having a double-layer structure, wherein the insulating layer 4 comprises an interlayer insulating layer 41 and a gate insulating layer 42. A thin-film transistor as such further includes a gate electrode 6.

In order to prevent the active layer 3 from being affected by the impurity particles in the glass substrate 8, a buffer layer 7 can be disposed over the glass substrate 8 prior to forming an active layer 3, and after that, the active layer 3 can be disposed over the buffer layer 7. The gate insulating layer 42 is disposed over the active layer 3, the first etch stopper 11, the second etch stopper 12, and the buffer layer 7. The interlayer insulating layer 41 is disposed over the gate insulating layer 42, and the gate electrode 6 is sandwiched between the interlayer insulating layer 41 and the gate insulating layer 42.

When the insulating layer 4 is etched to form contact vias, the interlayer insulating layer 41 and the gate insulating layer 42 need to be etched thoroughly to thereby expose the first etch stopper 11 and the second etch stopper 12 to complete the etching process to form the contact vias.

Optionally, the buffer layer 7 can have a composition of silicon oxide and/or silicon nitride; the active layer 3 can have a composition of polycrystalline silicon; the gate insulating layer can have a composition of silicon oxide, and the interlayer insulating layer 41 can have a composition of silicon oxide or silicon nitride.

Specifically, if the gate insulating layer 42 has a composition of silicon oxide, the thickness of the gate insulating layer 42 can be around 800 Å-1200 Å. If the gate electrode 6 has a composition of molybdenum, the thickness of the gate electrode 6 can be around 2000 Å.

If the interlayer insulating layer 41 has a composition of silicon oxide, the thickness of the interlayer insulating layer 41 can be around 1500 Å. If the interlayer insulating layer 41 has a composition of silicon nitride, the thickness of the interlayer insulating layer 41 can be around 3000 Å.

FIG. 4 and FIG. 5 illustrate a thin-film transistor employed in an Organic Light-Emitting Diode (OLED) display panel. In addition to the thin-film transistor, the OLED display panel further comprises a planarizing layer 91, an anode layer 92, and a pixel defining layer 93.

The planarizing layer 91 can be disposed over the insulating layer 4, the source electrode 21, and the drain electrode 22. The anode layer 92 is disposed over the planarizing layer 91 and the source electrode 21. The pixel defining layer 93 is disposed over the planarizing layer 91 and between the anode layers 92 of neighboring pixels.

Optionally, the planarizing layer 91 can have a composition of acrylic, and can have a thickness of around 20000 Å; the anode layer 92 can have a composition of an indium zinc oxide or an indium tin oxide, and can have a thickness of around 1500 Å. The pixel defining layer 93 can have a composition of polyimide, and can have a thickness of around 10000 Å.

Optionally, the source electrode 21 can be of an N-layer structure, where N is an integer greater than 0. A first layer of the source electrode 21 can be configured to contact with, and electrically couple with, the first etch stopper 11. The first etch stopper 11 can have a same composition as the first layer in the source electrode 21.

The second etch stopper 12 can have a same composition as the first etch stopper 11. The drain electrode 22 and the source electrode 21 can have a same composition and a same structure.

The first etch stopper 11 and the first layer in the source electrode 21 can have a same composition. The second etch stopper 12 and the first layer in the drain electrode 22 can have a same composition. Such a configuration ensures that the presence of the first etch stopper 11 and the second etch stopper 12 would not reduce the electrical conductivity between the active layer 3 and the source electrode 21 and the drain electrode 22.

Optionally, N can be 1, 2 or 3. If the number of layers of the source electrode 21 is 2 or 3, neighboring layers have different compositions.

Optionally, the source electrode 21 and the drain electrode 22 can have a composition of a metal.

Optionally, the source electrode 21 and the drain electrode 22 can comprise at least one of molybdenum, titanium, and aluminum.

Optionally, the first etch stopper 11 can have a composition of a metal, and the second etch stopper 12 can have a same composition as the first etch stopper 11.

In one preferred embodiment, the first etch stopper 11 can comprise molybdenum, and the second etch stopper 12 can have a same composition as the first etch stopper 11. If the first etch stopper 11 and the second etch stopper 12 both have a composition of a conductive metal, after completing the etching process to form contact vias, the portions of the first etch stopper 11 and the second etch stopper 12 that are exposed can be oxidized.

If the first etch stopper 11 and the second etch stopper 12 comprise molybdenum, after oxidization of the metal molybdenum, because the oxidized molybdenum (i.e. molybdenum oxide) is water soluble, the molybdenum oxides can be removed by direct cleansing using water. As such, the subsequent fabrication processes can be simplified. In addition, the first etch stopper 11 and the second etch stopper 12 can also comprise titanium or aluminum.

Optionally, the thicknesses of the first etch stopper 11 and the second etch stopper 12 can be between 220 Å and 400 Å.

Optionally, the active layer 3 can comprise low temperature poly-silicon (LTPS).

Figure 6:
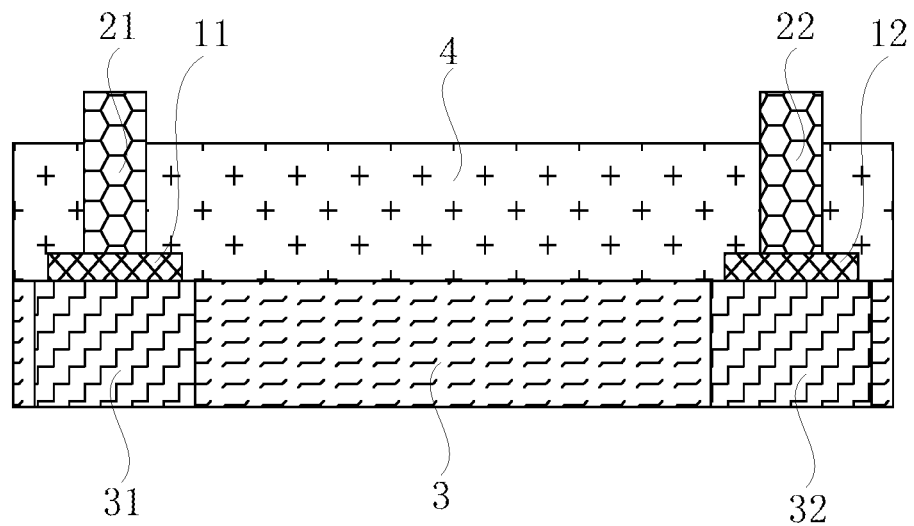
FIG. 6 is a schematic view of the structure of the thin-film transistor according to some embodiments of the present disclosure.

If the active layer 3 comprises low temperature poly-silicon (LTPS), as shown in FIG. 6, the active layer 3 optionally further comprises a first doping region 31 and a second doping region 32, and the first etch stopper 11 is disposed over the first doping region 31, and the second etch stopper 12 is disposed over the second doping region 32.

Optionally, the first doping region 31 and the second doping region 32 can both be heavily doped regions.

In this embodiment of the thin-film transistor, by arranging a first etch stopper 11 and a second etch stopper 12 between the insulating layer 4 and the active layer 3, the insulating layer 4 can be directly and thoroughly etched when the insulating layer 4 is etched to form contact vias. Because of the blocking by the first etch stopper 11 and the second etch stopper 12, the active layer 3 cannot be etched in the etching process. As such, this embodiment solves the issues of under-etching and over-etching in the etching process to form contact vias, which can thus lead to an improved production yield of thin-film transistors.

Additionally, the first etch stopper 11 has a same composition as, and is configured to contact with, the first layer in the source electrode 21. The first etch stopper 11 and the second etch stopper 12 are configured to have a same composition. The source electrode 21 and the drain electrode 22 are configured to have a same composition and a same structure. All these above configurations ensure that the presence of the first etch stopper 11 and the second etch stopper 12 would not affect the electrical conductivity between the active layer 3 and the source electrode 21 and the drain electrode 22.

In a second aspect, the present disclosure further provides an array substrate. The array substrate comprises a thin-film transistor according to any of the embodiments as described above, which thus solves the issues of under-etching and over-etching in the etching process to form contact vias and improves the yield rate of thin-film transistors.

Additionally, the first etch stopper 11 has a same composition as, and is configured to contact with, the first layer in the source electrode 21. The first etch stopper 11 and the second etch stopper 12 are configured to have a same composition. The source electrode 21 and the drain electrode 22 are configured to have a same composition and a same structure. All these above ensure that the presence of the first etch stopper 11 and the second etch stopper 12 would not affect the electrical conductivity between the active layer 3 and the source electrode 21 and the drain electrode 22.

As such, the array substrate according to any of the embodiments of the present disclosure as described above has a relatively high production yield, and a relatively good conductivity between the active layer 3 and the source electrode 21 and the drain electrode 22.

In a third aspect, the present disclosure further provides a display apparatus. The display apparatus comprises an array substrate according to any of embodiments as described above.

The display apparatus as such solves the issues of under-etching and over-etching in the etching process to form contact vias and improves the yield rate of array substrates.

Additionally, the first etch stopper 11 has a same composition as, and is configured to contact with, the first layer in the source electrode 21. The first etch stopper 11 and the second etch stopper 12 are configured to have a same composition. The source electrode 21 and the drain electrode 22 are configured to have a same composition and a same structure. All these above ensure that the presence of the first etch stopper 11 and the second etch stopper 12 would not affect the electrical conductivity between the active layer 3 and the source electrode 21 and the drain electrode 22.

As such, the display apparatus according to any of the embodiments of the present disclosure as described above has a relatively high production yield, and a relatively good conductivity between the active layer 3 and the source electrode 21 and the drain electrode 22.

Figure 9:
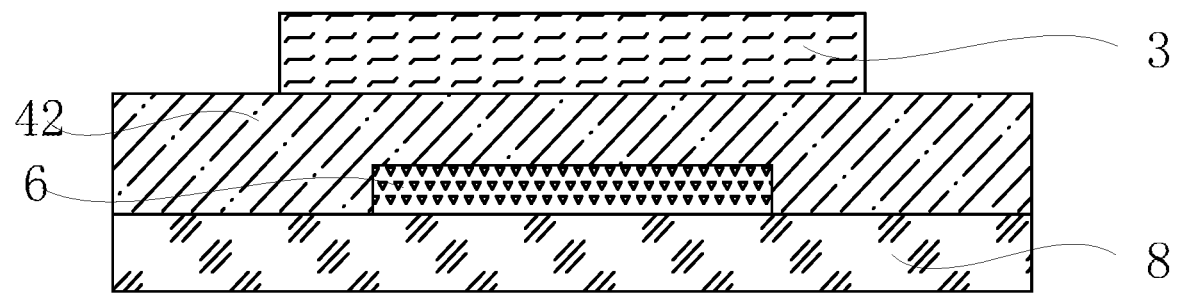
Figure 10:
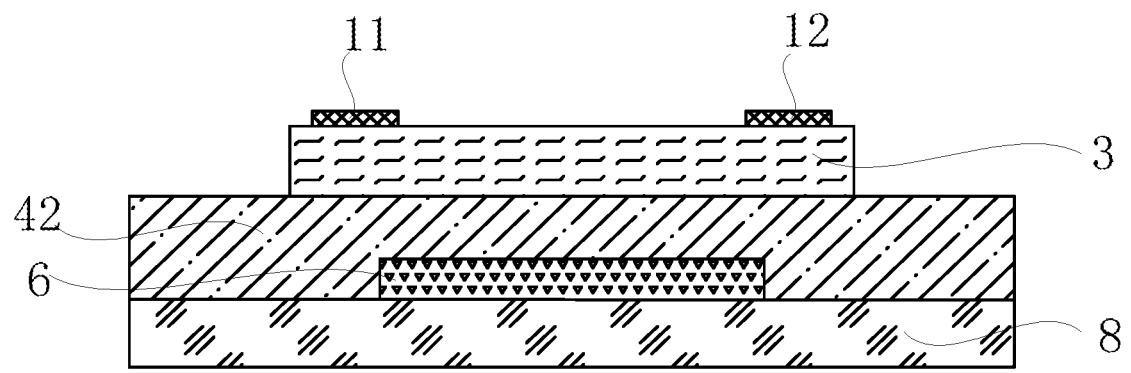
Figure 11:
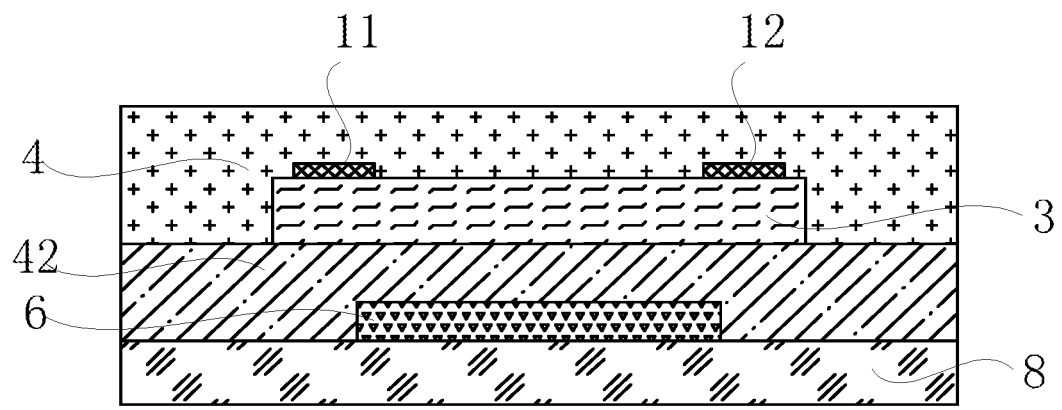
Figure 12:
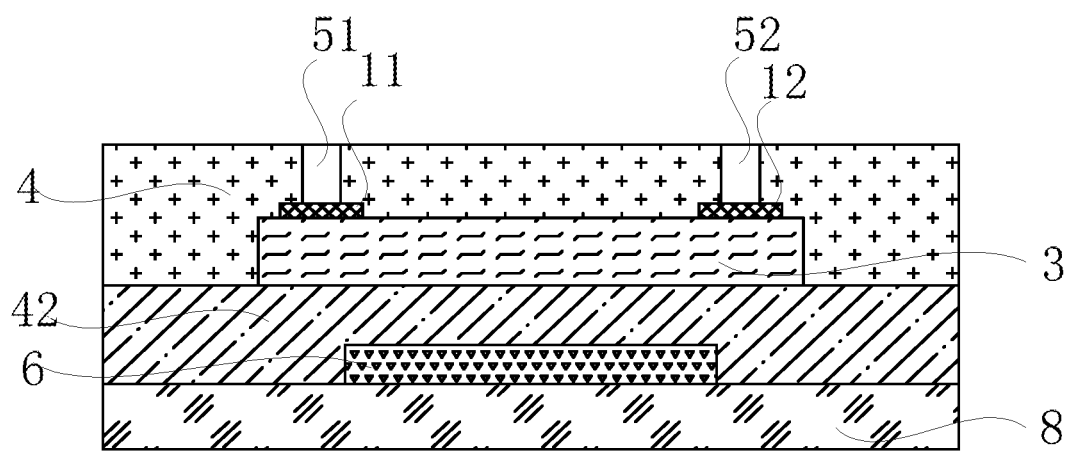

In a fourth aspect, the present disclosure further provides a method for manufacturing a thin-film transistor according to any of the embodiments as described above. The manufacturing method comprises:

Forming an active layer 3, as shown in FIG. 9;

Forming a first etch stopper 11 and a second etch stopper 12 over the active layer 3, as shown in FIG. 10;

Forming an insulating layer 4 over the active layer 3, the first etch stopper 11, and the second etch stopper 12, as shown in FIG. 11;

Etching the insulating layer 4 at positions corresponding to the first etch stopper 11 and the second etch stopper 12 to form a first contact via 51 and a second contact via 52, wherein the first etch stopper 11 and the second etch stopper 12 are exposed, as shown in FIG. 12;

Forming a source electrode 21 and a drain electrode 22 in the first contract via 51 and the second contact via 52 respectively, as shown in FIG. 1-FIG. 6.

In the embodiment, when etching the insulating layer 4 to form the first contact via 51 and the second contact via 52, the insulating layer 4 can be directly etched through onto the first etch stopper 11 and the second etch stopper 12. The issue of under-etching can thereby be effectively solved.

On the other hand, the presence of the first etch stopper 11 and the second etch stopper 12 substantially blocks the etching to the active layer 3, thereby effectively solving the issue of over-etching. As such, the production yield of thin-film transistors can thus be improved.

Optionally, prior to forming a source electrode 21 and a drain electrode 22 in the first contract via 51 and the second contact via 51, the method further comprises:

Performing a patterning process on the first etch stopper 11 and the second etch stopper 12 by means of a negative photoresist.

Optionally, the insulating layer 4 can be of a single-layer structure, or of a double-layer structure, or of a laminated structure.

Figure 7:
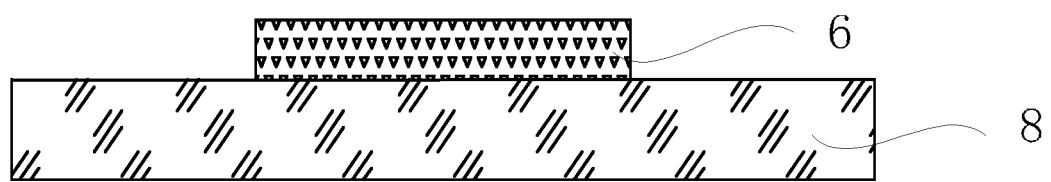
FIGS. 7-20 are schematic views illustrating a method for manufacturing a thin-film transistor according to some embodiments of the present disclosure.
Figure 8:
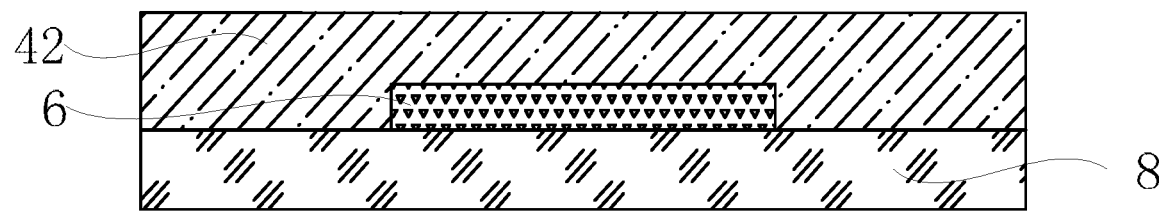

Specifically, if the insulating layer 4 is of a single-layer structure, the insulating layer 4 comprises an interlayer insulating layer 41, and the manufacturing method further comprises:

Forming a gate electrode 6 over a glass substrate 8, as shown in FIG. 7;

Forming a gate insulating layer 42 over the gate electrode 6 and the glass substrate 8, as shown in FIG. 8; and Forming an active layer 3 over the gate insulating layer 42, as shown in FIG. 9.

If the insulating layer 4 is of a single-layer structure, at the same time of forming the insulating layer 4 over the active layer 3, the first etch stopper 11, and the second etch stopper 12, the manufacturing method further comprises:

Forming an insulating layer 4 over the gate insulating layer 42.

Specifically, as shown in FIG. 11, if the insulating layer 4 is of a single layer structure, the insulating layer 4 formed over the active layer 3, the first etch stopper 11, and the second etch stopper 12, as well as the insulating layer 4 formed over the gate insulating layer 42, can be formed in the same step.

As shown in FIG. 2 and FIG. 12, when etching the insulating layer 4 to form the contact vias, the interlayer insulating layer 41 needs to be thoroughly etched to expose the first etch stopper 11 and the second etch stopper 12 so as to complete the etching process to form the contact vias.

Figure 18:
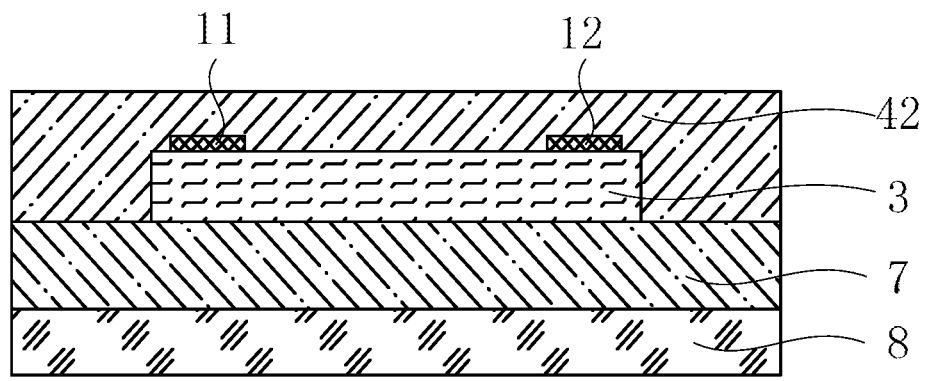
Figure 19:
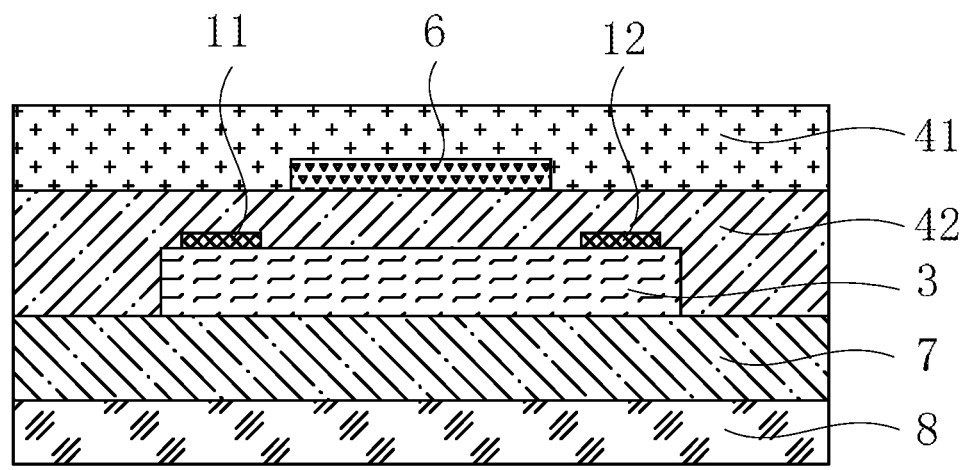

Specifically, if the insulating layer 4 is of a double-layer structure, the insulating layer 4 comprises an interlayer insulating layer 41 and a gate insulating layer 42, and forming an insulating layer 4 over the active layer 3, the first etch stopper 11 and the second etch stopper 12 further comprises:

Forming a gate insulating layer 42 over the active layer 2, the first etch stopper 11 and the second etch stopper 12, as shown in FIG. 18; and Forming an interlayer insulating layer 41 over the gate insulating layer 42, as shown in FIG. 19.

In this embodiment, prior to forming an interlayer insulating layer 41 over the gate insulating layer 42, the method can further comprise:

Forming a gate electrode 6 over the gate insulating layer 42, as shown in FIG. 19.

Figure 20:
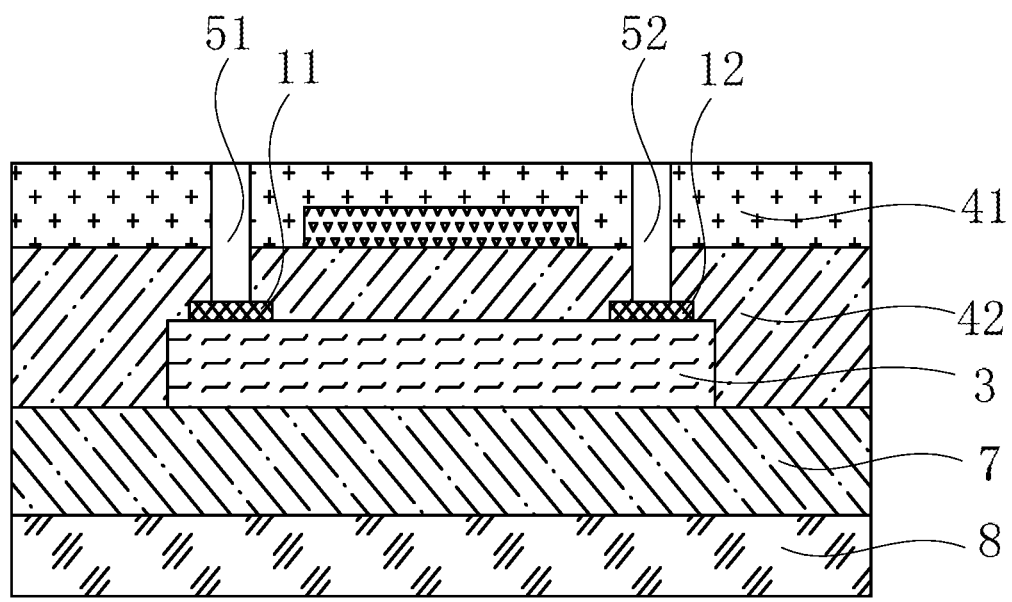

As shown in FIG. 3, FIG. 5 and FIG. 20, when etching the insulating layer 4 to form contact vias, the interlayer insulating layer 41 and the gate insulating layer 42 need to be etched thoroughly to thereby expose the first etch stopper 11 and the second etch stopper 12 so as to complete the etching process to form the contact vias.

Figure 15:
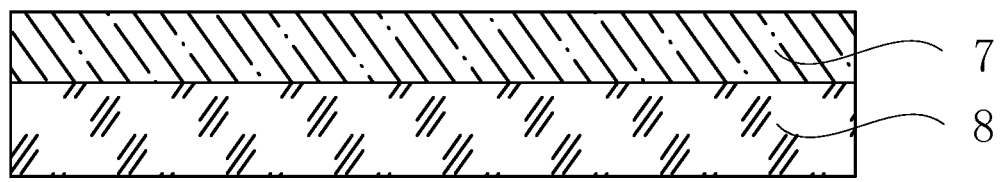

Optionally, if the insulating layer 4 is of a double-layer structure, the manufacturing method further comprises:

Forming a buffer layer 7 over a glass substrate 8, as shown in FIG. 15; and

Figure 16:
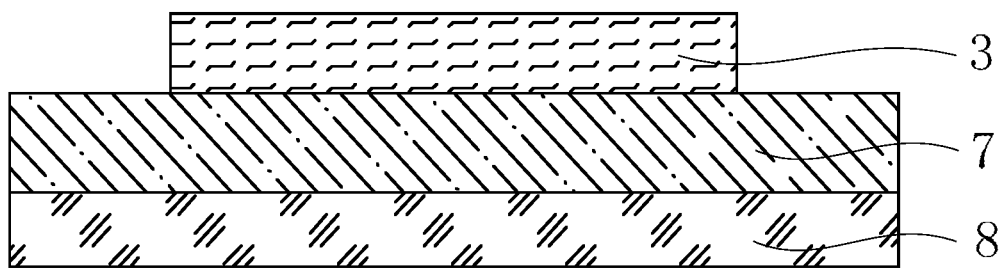
Figure 17:
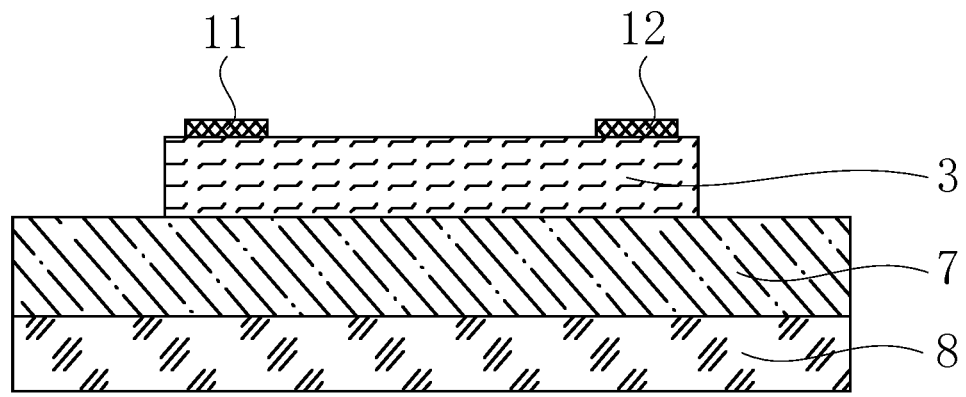

Forming an active layer 3 over the buffer layer 7, as shown in FIG. 16.

If the insulating layer 4 is a double-layer structure, at the same time of forming the gate insulating layer 42 over the active layer 3, the first etch stopper 11 and the second etch stopper 12, the manufacturing method further comprises:

Forming a gate insulating layer 42 over the buffer layer 7.

Specifically, if the insulating layer 4 is of a double-layer structure, forming a gate insulating layer 42 over the active layer 3, the first etch stopper 11, and the second etch stopper 12, and forming a gate insulating layer 42 over the buffer layer 7 as well, can be completed in a same step.

Optionally, the buffer layer 7 can have a composition of silicon oxide and/or silicon nitride, the active layer 3 can have a composition of poly-silicon, the gate insulating layer 42 can have a composition of silicon oxide, and the interlayer insulating layer 42 have a composition of silicon oxide or silicon nitride.

Optionally, the active layer 3 can have a composition of low temperature poly-silicon, and forming an active layer 3 specifically include:

Forming an amorphous silicon layer;

Performing annealing to the amorphous silicon layer;

Performing an excimer laser annealing process to the amorphous silicon layer after annealing, wherein the amorphous silicon layer is crystallized and the amorphous silicon layer is transformed into a low temperature poly-silicon layer;

Exposing and developing the low temperature poly-silicon layer by means of a positive photoresist to thereby form a patterned active layer 3, wherein the thickness of the positive photoresist is between 2 μm and 3 μm.

Specifically, if the active layer 3 has a composition of low temperature poly-silicon, prior to etching the insulating layer 4 at positions corresponding to the first etch stopper 11 and the second etch stopper 12 to form the first contact via 51 and the second contact via 51, the manufacturing method further comprises:

Performing injective excitation to the active layer 3 to improve the lattice state of the low temperature poly-silicon in the active layer 3 to thereby improve the conductivity of the active layer 3.

Specifically, if the insulating layer 4 is of a single-layer structure or a double layer-structure and the gate insulating layer 42 has a composition of silicon oxide, the gate insulating layer 42 can have a thickness between 800 Å-1200 Å.

If the gate electrode 6 comprises molybdenum, the thickness of the gate electrode 6 can be 2000 Å.

If the interlayer insulating layer 41 comprises silicon oxide, the thickness of the interlayer insulating layer 41 can be 1500 Å;

If the interlayer insulating layer 41 comprises silicon nitride, the thickness of the interlayer insulating layer 41 can be 3000 Å.

Figure 13:
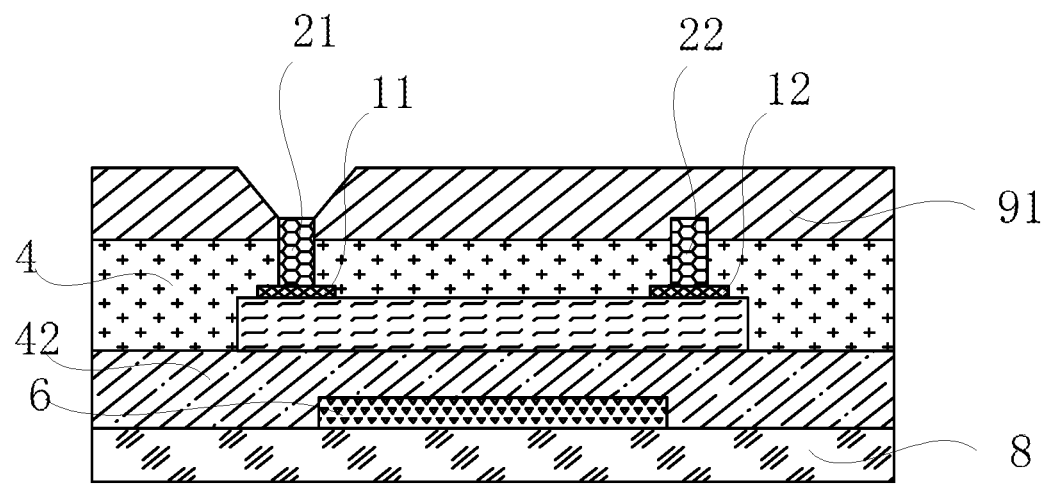
Figure 14:
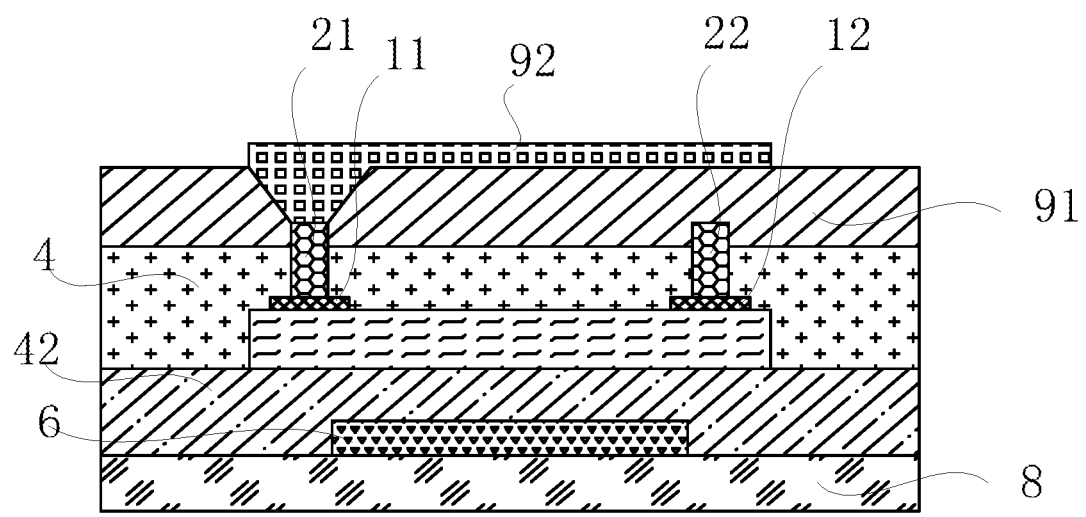

Optionally, when the thin-film transistor is employed for OLED back panel, the manufacturing method further comprises:

Forming a planarizing layer 91 over the insulating layer 4, the source electrode 21, and the drain electrode 22, as shown in FIG. 13;

Forming an anode layer 92 over the planarizing layer 91 and the source electrode 21, as shown in FIG. 14;

Forming a pixel defining layer 93 over the planarizing layer 91 such that the pixel defining layer 93 is disposed between the anode layers 92 of neighboring pixel units.

Optionally, the planarizing layer 91 can have a composition of acrylic, and can have a thickness of around 20000 Å. The anode layer 92 can have a composition of indium zinc oxide or indium tin oxide, and can have a thickness of around 1500 Å. The pixel defining layer 93 can have a composition of polyimide, and can have a thickness of around 10000 Å.

Optionally, the source electrode 21 can be of an N-layer structure, where N is an integer greater than 0. A first layer in the source electrode 21 can be configured to contact with, and electrically couple with, the first etch stopper 11. The first etch stopper 11 can have a same composition as the first layer in the source electrode 21.

The second etch stopper 12 and the first etch stopper 11 can have a same composition. The drain electrode 22 and the source electrode 21 can have a same composition and a same structure.

The first etch stopper 11 and the first layer in the source electrode 21 are configured to have a same composition, and the second etch stopper 12 and the first layer in the drain electrode 22 are configured to have a same composition. Such a configuration ensures that the existence of the first etch stopper 11 and the second etch stopper 12 would not reduce the electrical conductivity between the active layer 3 and the source electrode 21 and the drain electrode 22.

Optionally, the value of N can be 1, 2 or 3, and if the number of layers of the source electrode 21 is 2 or 3, neighboring layers in the source electrode 21 have different compositions.

Optionally, the source electrode 21 and the drain electrode 22 can comprise a metal. To be more specific, the source electrode 21 and the drain electrode 22 can comprise at least one of molybdenum, titanium, and aluminum.

Optionally, if the source electrode 21 and the drain electrode 22 comprise only molybdenum, the thickness of the source electrode 21 and the drain electrode 22 can be around 500 Å. If the source electrode 21 and the drain electrode 22 comprise only aluminum, the thickness of the source electrode 21 and the drain electrode 22 can be around 2200 Å.

Optionally, the first etch stopper 11 can comprise a metal; the second etch stopper 12 and the first etch stopper 11 can have a same composition.

Preferably, the first etch stopper 11 comprises molybdenum, the second etch stopper 12 and the first etch stopper 11 have a same composition. Under a circumstance where the first etch stopper 11 and the second etch stopper 12 both comprise a conductive metal material, the portions of the first etch stopper 11 and the second etch stopper 12 that are exposed can be oxidized after completion of the etching process to form contact vias.

Under a circumstance where the first etch stopper 11 and the second etch stopper 12 both comprise molybdenum, after the metal molybdenum is oxidized, the oxidized substance is a water-soluble substance, and thereby the oxidized molybdenum can be directly removed by cleansing with water.

As such, the subsequent processes during manufacturing can be simplified if molybdenum is employed as the material of the etch stoppers. In addition, the first etch stopper 11 and the second etch stopper 12 can also comprise titanium or aluminum.

If the first etch stopper 11 and the second etch stopper 12 both comprise molybdenum, the thicknesses of the first etch stopper 11 and the second etch stopper 12 can be between 200 Å and 400 Å.

If the active layer 3 has a composition of low temperature poly-silicon, as shown in FIG. 6, optionally, the active layer 3 can comprise a first doping region 31 and a second doping region 32, wherein the first etch stopper 11 is disposed over the first doping region 31, the second etch stopper 12 is disposed over the second doping region 32.

Specifically, before forming the first etch stopper 11 and the second etch stopper 12 over the active layer 3, the manufacturing method can further comprise:

Performing doping to the active layer 3 to thereby form a first doping region 31 and a second doping region 32 respectively in the active layer 3.

Optionally, the first doping region 31 and the second doping region 32 can both be heavily doped regions.

In this embodiment of the method for manufacturing a thin-film transistor, by arranging a first etch stopper 11 and a second etch stopper 12 between the insulating layer 4 and the active layer 3, the insulating layer 4 can be directly and thoroughly etched when the insulating layer 4 is etched to form contact vias. Because of the blocking by the first etch stopper 11 and the second etch stopper 12, the active layer 3 cannot be etched in the etching process. As such, this embodiment of the fabrication method solves the issues of under-etching and over-etching in the etching process to form contact vias, which can lead to an improved production yield of thin-film transistors.

Additionally, the first etch stopper 11 has a same composition as, and is configured to contact with, the first layer in the source electrode 21. The first etch stopper 11 and the second etch stopper 12 are configured to have a same composition. The source electrode 21 and the drain electrode 22 are configured to have a same composition and a same structure. All these above configurations ensure that the presence of the first etch stopper 11 and the second etch stopper 12 would not affect the electrical conductivity between the active layer 3 and the source electrode 21 and the drain electrode 22.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method for manufacturing a thin-film transistor, comprising:
   forming a first layer;
   forming at least one etch stopper over the first layer;
   forming a second layer over the first layer and the at least one etch stopper;
   forming at least one contact via in the second layer, such that a bottom opening of each contact via contacts with a top surface of one etch stopper; and
   forming at least one electrode in the at least one contact via, such that each electrode extends in one contact via respectively, and is in contact with, and electrically coupled with, the one etch stopper;
   wherein:
      the at least one etch stopper comprises a composition capable of blocking etching to the first layer during formation of the at least one contact via in the second layer;
      an oxidization product of the composition is readily removable by a solution; or
      an oxidization product of the composition is conductive; or
      the composition is resistant to oxidization;
      the method further comprises, between the forming a first layer and the forming at least one etch stopper over the first layer:
         forming at least one doping region in the first layer; and
      the forming at least one etch stopper over the first layer comprises:
         forming at least one etch stopper respectively over the at least one doping region in the first layer;
         wherein the at least one electrode include a source electrode having an N-layer structure, N is an integer, and a first layer of the N-layer structure has a same composition as a first etch stopper of the at least one etch stopper;
   wherein:
   the first layer is an active layer;
   the second layer is an insulating layer;
   the at least one contact via comprises a first contact via and a second contact via;
   the at least one etch stopper comprises the first etch stopper and a second etch stopper;
   the at least one electrode comprises the source electrode and a drain electrode, disposed in the first contact via and the second contact via respectively, and electrically coupled with the first etch stopper and the second etch stopper, respectively;
   the drain electrode is also an N-layer structure, N is an integer, and a first layer of the N-layer structure of the drain electrode has a same composition as the second etch stopper, such that the first etch stopper and the second etch stopper do not reduce electrical conductivity between the active layer and the source electrode and the drain electrode;
   the active layer comprises low temperature poly-silicon (LTPS); and
   the method further comprises performing injective excitation to the active layer to improve a lattice state of the LTPS in the active layer to thereby improve a conductivity of the active layer.

2. The method according to claim 1, wherein the oxidization product of the composition is readily removable by a solution.

3. The method according to claim 2, wherein the composition comprises at least one of molybdenum, titanium, or aluminum, and the each contact via has a projection on the top surface of the etch stopper smaller than the etch stopper in area.

4. The method according to claim 3, wherein the composition comprises molybdenum.

5. The method according to claim 1, wherein:
   the method further comprises, prior to the forming a first layer:
      forming a gate electrode over a substrate; and
      forming a gate insulating layer over the gate electrode and the substrate;
   the forming a first layer comprises:
      forming an active layer over the gate insulating layer; and
   forming a second layer over the first layer and the at least one etch stopper comprises:
      forming an insulating layer over the gate insulating layer, the active layer, the first etch stopper, and the second etch stopper.

6. The method according to claim 1, wherein:
   the method further comprises, between the forming a second layer over the first layer and the at least one etch stopper and the forming at least one contact via in the second layer:
      forming a gate electrode over the insulating layer; and
      forming a gate insulating layer over the gate electrode and the insulating layer; and
   the forming at least one contact via in the second layer comprises:
      forming a first contact via and a second contact via through the insulating layer and the gate insulating layer.

7. The method according to claim 6, wherein:
   the method further comprises, prior to the forming a first layer:
      forming a buffer layer over a substrate;
   the forming a first layer comprises:
      forming an active layer over the buffer layer; and
   the forming a second layer over the first layer and the at least one etch stopper comprises:
      forming an insulating layer over the buffer layer, the active layer, the first etch stopper, and the second etch stopper.

8. The method according to claim 1, further comprising:
   forming a planarizing layer over the insulating layer, the source electrode and the drain electrode, wherein the planarizing layer is provided with a third contact via, disposed over the source electrode; and forming an anode layer over the planarizing layer, wherein the anode layer is configured to electrically couple with the source electrode through the third contact via.

9. A thin-film transistor, comprising:
a first layer;
at least one etch stopper, disposed over the first layer;
a second layer, disposed over the first layer and the at least one etch stopper;
at least one contact via, disposed in the second layer and configured such that a bottom opening of each contact via is in contact with a top surface of one etch stopper; and
at least one electrode, disposed in the at least one contact via and configured such that each electrode extends in one contact via respectively, and is in contact with, and electrically coupled with, the one etch stopper;
wherein:
the at least one etch stopper comprises a composition capable of blocking etching to the first layer during etching to form the at least one contact via in the second layer;
an oxidization product of the composition is readily removable by a solution; or
an oxidization product of the composition is conductive; or
the composition is resistant to oxidization;
the active layer comprises a first doping region and a second doping region; and
the first etch stopper and the second etch stopper are respectively disposed over the first doping region and the second doping region;
wherein the at least one electrode include a source electrode having an N-layer structure, N is an integer of at least 2, and a first layer of the N-layer structure has a same composition as a first etch stopper of the at least one etch stopper.

10. The thin-film transistor of claim 9, wherein an oxidization product of the composition is readily removable by a solution, and the at least one etch stopper is formed prior to the at least one contact via.

11. The thin-film transistor of claim 10, wherein the composition comprises at least one of molybdenum, titanium, or aluminum.

12. The thin-film transistor of claim 9, wherein:
the first layer is an active layer;
the at least one etch stopper comprises the first etch stopper and a second etch stopper;
the second layer is an insulating layer,
the at least one contact via comprises two contact vias; and
at least one electrode comprises the source electrode and a drain electrode;
wherein the drain electrode is also an N-layer structure, N is an integer of at least 2, and a first layer of the N-layer structure of the drain electrode has a same composition as the second etch stopper, such that the first etch stopper and the second etch stopper do not reduce electrical conductivity between the active layer and the source electrode and the drain electrode.

13. The thin-film transistor of claim 12, further comprising a gate electrode and a gate insulating layer, wherein:
the gate electrode is disposed over the insulating layer;
the gate insulating layer is disposed over the insulating layer and the gate electrode; and
the two contact vias further run through the gate insulating layer.

14. The thin-film transistor of claim 12, further comprising a gate electrode and a gate insulating layer, wherein:
the gate electrode is disposed over a substrate; and
the gate insulating layer is disposed over the substrate and the gate electrode and below the active layer and the insulating layer.

15. The thin-film transistor of claim 12, further comprising a planarizing layer and an anode layer, wherein:
the planarizing layer is disposed over the insulating layer, the source electrode and the drain electrode, and is provided with a third contact via;
the anode layer is disposed over the planarizing layer, and is electrically coupled with the source electrode through the third contact via.

16. The thin-film transistor of claim 12, wherein:
the active layer comprises low temperature poly-silicon (LTPS);
and the active layer is injection excited to improve a lattice state of the LTPS in the active layer to thereby improve a conductivity of the active layer.

17. The thin-film transistor of claim 9, wherein:
each electrode is of an N-layer structure, where N is an integer greater than 0; and
a contact layer of each electrode, in contact with and electrically coupled to, one etch stopper, is configured to have a same composition as the one etch stopper.

18. A display apparatus, comprising a thin-film transistor according to claim 9.

* * * * *